(12) United States Patent
Lee

(10) Patent No.: US 7,629,662 B2
(45) Date of Patent: Dec. 8, 2009

(54) IMAGE SENSOR AND FABRICATING METHOD THEREOF

(75) Inventor: Sang Uk Lee, Eumseong-goon (KR)

(73) Assignee: Dongbu Hitek Co., Ltd., Seoul (KR)

( * ) Notice: Subject to any disclaimer, the term of this patent is extended or adjusted under 35 U.S.C. 154(b) by 133 days.

(21) Appl. No.: 11/782,843

(22) Filed: Jul. 25, 2007

(65) Prior Publication Data

US 2008/0128843 A1 Jun. 5, 2008

(30) Foreign Application Priority Data

Nov. 30, 2006 (KR) .................. 10-2006-0119471

(51) Int. Cl.
*H01L 31/0232* (2006.01)
(52) U.S. Cl. .............. 257/440; 257/431; 257/E31.093; 257/E31.121; 257/E31.127
(58) Field of Classification Search .............. 385/129, 385/131; 257/432, 440; 438/70
See application file for complete search history.

(56) References Cited

U.S. PATENT DOCUMENTS 7,312,093 B2 * 12/2007 Ryu ........................... 438/29

2007/0008421 A1 * 1/2007 Wu et al. .................. 348/340
2007/0026564 A1 * 2/2007 Wu et al. .................... 438/69

FOREIGN PATENT DOCUMENTS

KR    10-2005-0134129    4/2007

* cited by examiner

*Primary Examiner*—Victor A Mandala
*Assistant Examiner*—William Harriston
(74) *Attorney, Agent, or Firm*—Saliwanchik, Lloyd & Saliwanchik

(57) ABSTRACT

An image sensor is provided having: a color filter layer including a red color filter with a first thickness, a green color filter with a second thickness, and a blue color filter with a third thickness; and a microlens array having a first microlens with a fourth thickness formed on the red color filter, a second microlens with a fifth thickness formed on the green color filter, and a third microlens with a sixth thickness formed on the blue color filter. In one embodiment, the sums of the first thickness and the fourth thickness, the second thickness and the fifth thickness, and the third thickness and the sixth thickness can be the same.

10 Claims, 6 Drawing Sheets

IMAGE SENSOR AND FABRICATING METHOD THEREOF

CROSS-REFERENCE TO RELATED APPLICATION

The present application claims the benefit under 35 U.S.C. §119 of Korean Patent Application No. 10-2006-0119471, filed Nov. 30, 2006, which is hereby incorporated by reference in its entirety.

BACKGROUND

An image sensor is a semiconductor element that converts an optical image into an electrical signal.

FIG. 1 is a view showing a state where a photoresist for forming a microlens is patterned according to a fabricating method of an image sensor in the related art, FIG. 2 is a cross-sectional view taken along line I-I' of FIG. 1, and FIG. 3 is a cross-sectional view taken along line II-II' of FIG. 1.

According to the fabricating method of the image sensor in the related art, as shown in FIGS. 1 to 3, microlenses are formed by patterning photoresist patterns 31, 33, and 35 for a microlens on a red color filter 11, a green color filter 13, and a blue color filter 15, respectively.

At this time, there are step differences in the height of the upper surfaces of the red color filter 11, the green color filter 13, and the blue color filter 15. Therefore, a planarization layer 21 is formed on the red color filter 11, the green color filter 13, and the blue color filter 15. Accordingly, the photoresist patterns 31, 33, and 35 are formed on the planarization layer 21.

A thermal processing process such as a thermal reflow process is performed on the photoresist patterns, making it possible to form the image sensor as shown in FIGS. 4 to 6. Here, FIG. 4 is a view showing a state where the microlenses are formed by means of the fabricating method of the image sensor in the related art, FIG. 5 is a cross-sectional view taken along line III-III' of FIG. 4, and FIG. 6 is a cross-sectional view taken along line IV-IV' of FIG. 4.

With the fabricating method of the image sensor in the related art, microlenses 41, 43, and 45 having the same thickness and the same shape are formed on the red color filter 11, the green color filter 13, and the blue color filter 15, respectively. In general, blue light has a wavelength band of about 455 nm, green light has a wavelength band of about 555 nm, and red light has a wavelength band of about 655 nm.

FIG. 7 is a view for explaining a state where light incident from the image sensor fabricated according to the fabricating method of the image sensor in the related art is condensed.

With the image sensor in the related art, as shown in FIG. 7, when the thickness and the shape of the microlenses 41, 43, and 45 performing a condensing function on the three color filters 11, 13, and 15 are the same, the positions where the light is focused onto a light receiving unit are different from each other because of the difference of wavelengths according to colors. In the case of blue light with the shortest wavelength, the focus is on the closest position from the microlens 45, in the case of green light, the focus is on the middle from the microlens 45, and in the case of red light, the focus is on the farthest position from the microlens 41. Therefore, the degree of light condensing on light receiving units 51, 53, and 55 formed at the same position is different so that the characteristics of the image sensor is degraded.

BRIEF SUMMARY

Embodiments of the present invention provide an image sensor and a fabricating method thereof capable of condensing light through red, green, and blue color filters with a desired focal length.

An image sensor according to an embodiment includes: a color filter layer having a red color filter with a first thickness, a green color filter with a second thickness, and a blue color filter with a third thickness; and a microlens array having a first microlens with a fourth thickness formed on the red color filter, a second microlens with a fifth thickness formed on the green color filter, and a third microlens with a sixth thickness formed on the blue color filter.

A fabricating method of an image sensor according to an embodiment includes: forming a color filter layer having a red color filter with a first thickness, a green color filter with a second thickness, a blue color filter with a third thickness; forming a photoresist for forming a microlens on the color filter layer; patterning the photoresist for forming the microlens; and performing a thermal process to form a microlens array having a first microlens with a fourth thickness formed on the red color filter, a second microlens with a fifth thickness formed on the green color filter, and a third microlens with a sixth thickness formed on the blue color filter.

DETAILED DESCRIPTION

In the description of the embodiments, when each layer (film), area, pattern or structure is described as being formed "on/above" or "below/under" each layer (film), area, pattern or structure, it can be understood as being formed in direct contact with the layer (film), area, pattern or structure or other layer (film), area, pattern or structure may be additionally formed therebetween.

Hereinafter, an image sensor and fabricating method thereof according to embodiments of the present invention will be described with reference to the accompanying drawings.

Figure 1:
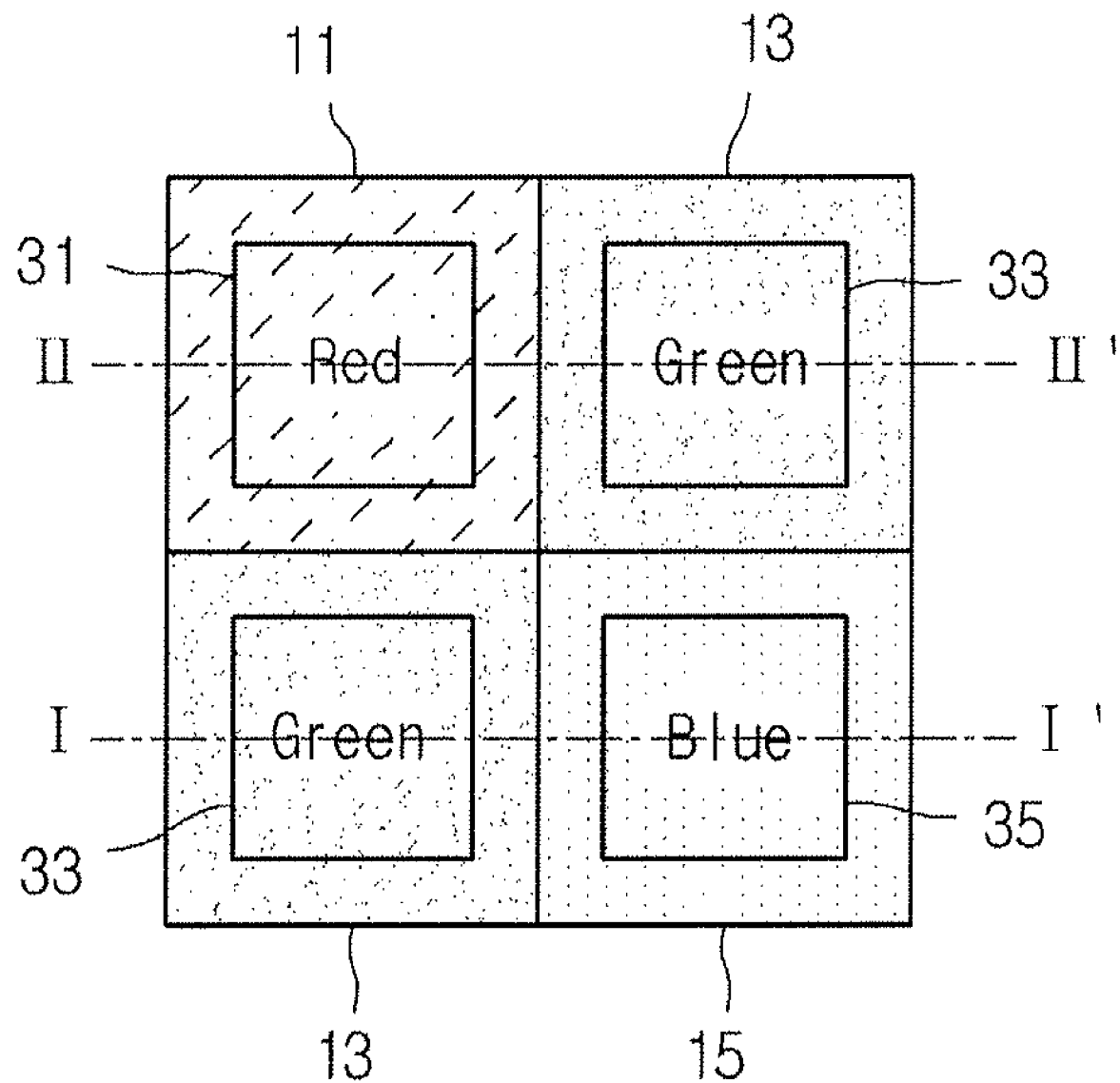
FIG. 1 is a plan view showing a state where a photoresist for forming a microlens is patterned according to a fabricating method of an image sensor in the related art.
Figure 2:
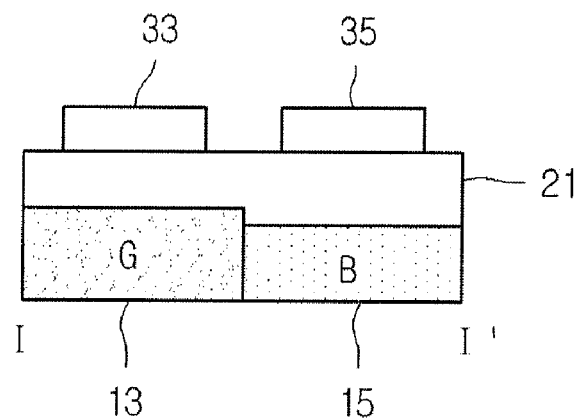
FIG. 2 is a cross-sectional view taken along line I-I' of FIG. 1.
Figure 3:
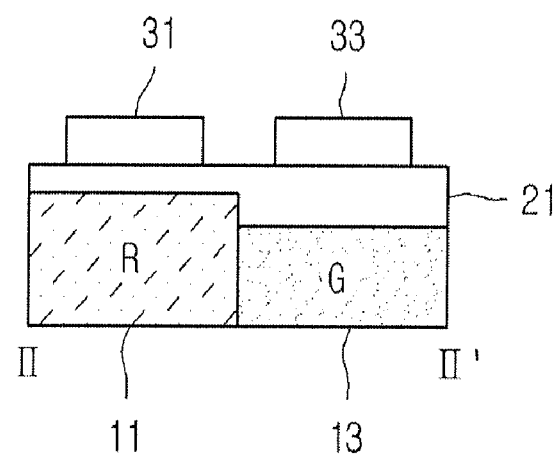
FIG. 3 is a cross-sectional view taken along line II-II' of FIG. 1.
Figure 4:
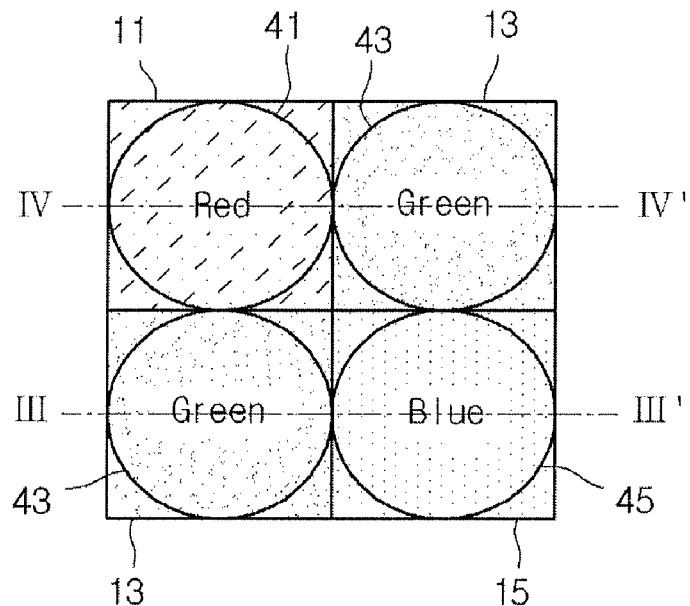
FIG. 4 is a plan view showing a state where the microlens is formed by means of the fabricating method of the image sensor in the related art.
Figure 5:
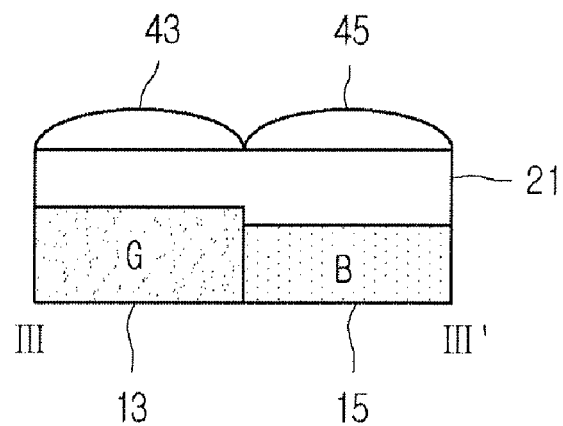
FIG. 5 is a cross-sectional view taken along line III-III' of FIG. 4.
Figure 6:
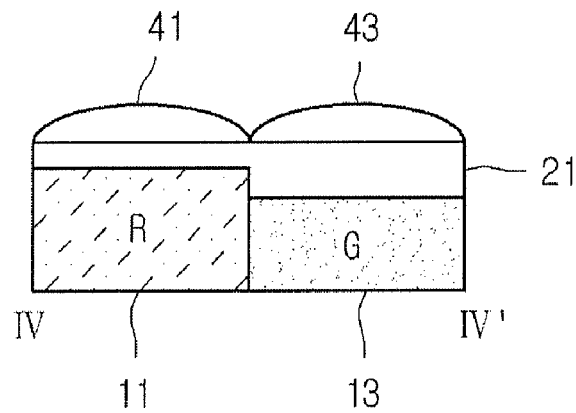
FIG. 6 is a cross-sectional view taken along line IV-IV' of FIG. 4.
Figure 7:
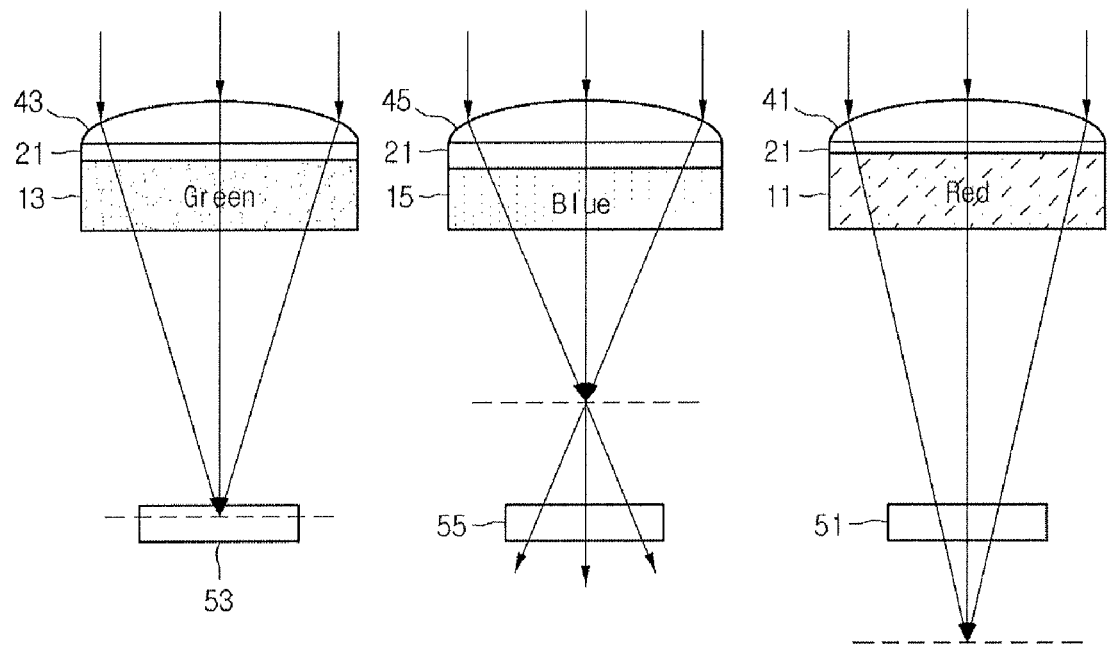
FIG. 7 is a view for explaining a state where light incident from an image sensor fabricated according to a fabricating method of an image sensor in the related art is condensed.
Figure 8:
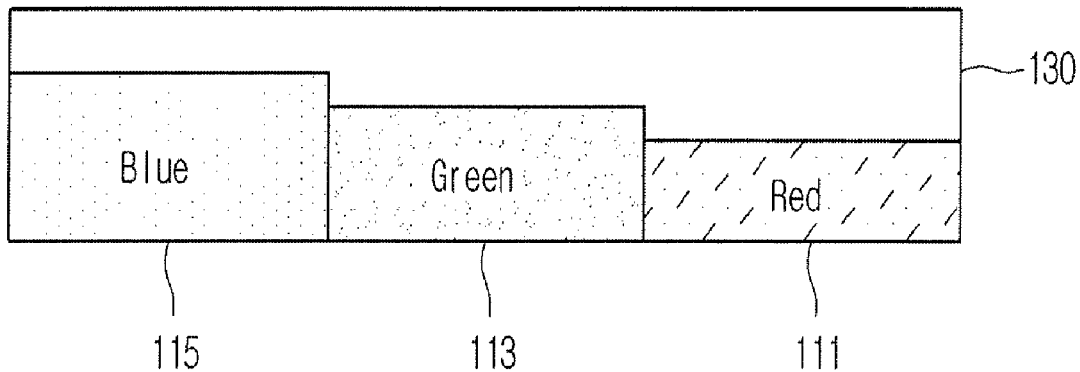
FIG. 8 is a cross-sectional view showing a state where a photoresist for forming a microlens is formed according to an embodiment of the present invention.

Referring to FIG. 8, a photoresist 130 for forming a microlens can be formed on a color filter layer having a red color filter 111, a green color filter 113, and a blue color filter 115.

According to one embodiment, the red color filter 111, the green color filter 113, and the blue color filter 115 can be formed in sequence to form the color filter layer.

The red color filter 111 can be formed to have a first thickness, the green color filter 113 can be formed to have a second thickness, and the blue color filter 115 can be formed to have a third thickness.

As one example, the green color filter 113 with the second thickness can be formed thicker than the red color filter 111 with the first thickness. Also, the blue color filter 115 with the third thickness can be formed thicker than the green color filter 113 with the second thickness.

As such, when the thicknesses of the red color filter 111, the green color filter 113, and the blue color filter 115 are formed to be different from each other, the upper surface of the color filter layer is not planarized. According to embodiments of the present invention, a planarization film is not formed on the color filter layer. Rather, the photoresist 130 for forming the microlenses can be formed to be in direct contact with the color filter layer. The photoresist 130 for forming the microlens can be formed in a coating manner where the upper surface of the photoresist 130 for forming the microlens is planar.

Figure 9:
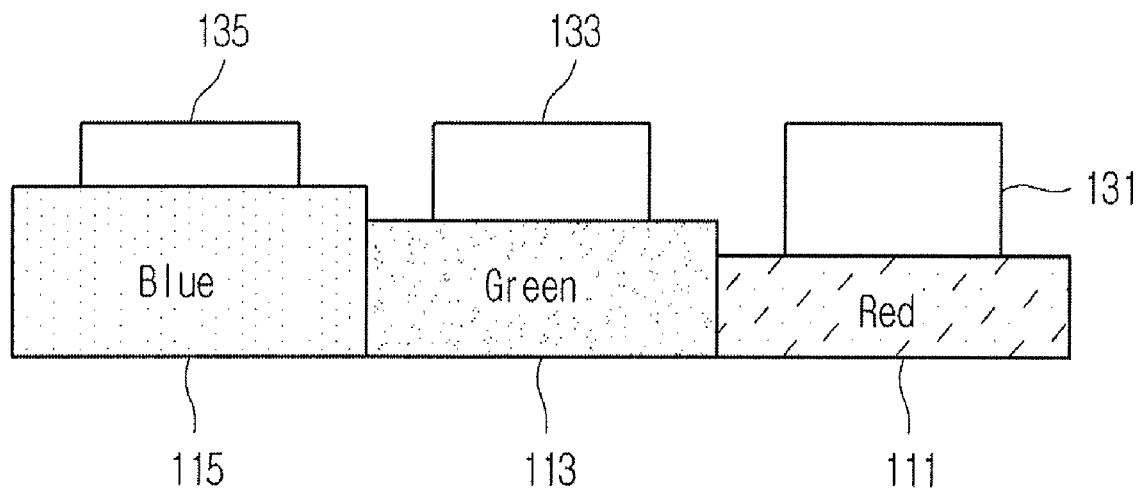
FIG. 9 is a cross-sectional view showing a state where a photoresist for forming a microlens is patterned according to an embodiment of the present invention.

Next, referring to FIG. 9, a patterning process is performed on the photoresist for forming the microlens.

A first photoresist pattern 131 is formed on the red color filter, a second photoresist pattern 133 is formed on the green color filter 113, and a third photoresist pattern 135 is formed on the blue color filter 115. This can be formed through exposure and development processes for the photoresist 130 for forming the microlenses.

Figure 10:
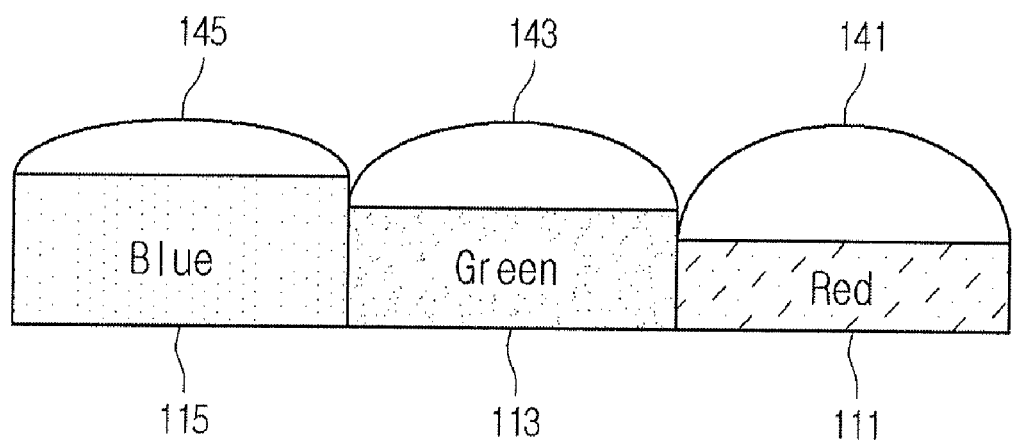
FIG. 10 is a cross-sectional view showing a state where a microlens is formed according to an embodiment of the present invention.

Then, referring to FIG. 10, a thermal processing process, such as a thermal reflow process can be performed.

Accordingly, a first microlens 141 with a fourth thickness is formed on the red color filter 111, a second microlens 143 with a fifth thickness is formed on the green color filter 113, and a third microlens 145 with a sixth thickness is formed on the blue color filter 115.

The first microlens 141, the second microlens 143, the third microlens 145 can be repeatedly arranged on a co-plane in a matrix form to form a microlens array.

According to embodiments, the thicknesses of the first microlens 141, the second microlens 143, and the third microlens 145 can be formed to be different from each other.

In a further embodiment, the combined thickness of a color filter and corresponding microlens can be the same for all color filters 111, 113, 115 and their corresponding microlenses 141, 143, 145, respectively.

That is, the sum of the first thickness of the red color filter 111 and the fourth thickness of the first microlens 141, the sum of the second thickness of the green color filter 113 and the fifth thickness of the second microlens 143, and the sum of the third thickness of the blue color filter 115 and the sixth thickness of the third microlens 145 are the same.

According to an embodiment example, the second microlens 143 with the fifth thickness can be formed to be thinner than the first microlens 141 with the fourth thickness. Also, the microlens 145 with the sixth thickness can be formed to be thinner than the second microlens 143 with the fifth thickness.

Figure 11:
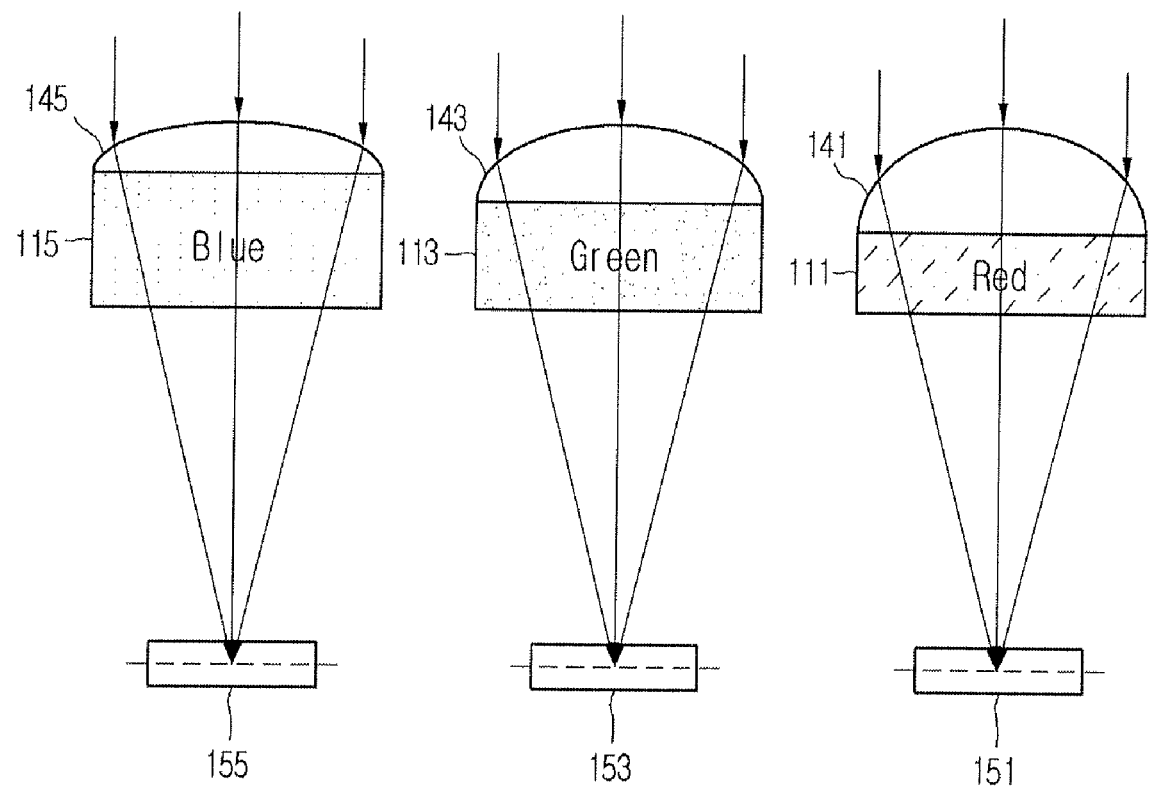
FIG. 11 is a view for explaining a state where light incident from an image sensor fabricated by means of a fabricating method of an image sensor according to an embodiment of the present invention is condensed.

FIG. 11 is a view for explaining a state where light incident from an image sensor fabricated according to an embodiment of the present invention is condensed.

Referring to FIG. 11, the distance where red light is condensed on a first receiving unit 151 through the first microlens 141, the distance where green light is condensed on a second receiving unit 153 through the second microlens 143, and the distance where blue light is condensed on a third receiving unit 155 through the third microlens 145 are the same.

That is, the thickness and surface shapes of the first microlens 141, the second microlens 143, and the third microlens 145 are controlled so that the red light, the green light, and the blue light with different wavelength bands are condensed at a same focal length on the first receiving unit 151, the second receiving unit 153, and the third receiving unit 155, respectively.

In an embodiment, all light can be focused on a desired depth by changing the thickness of the microlens according to the difference in height between the color filters. For the blue light with a short wavelength, the thickness of the microlens is thin, for the red light with a long wavelength, the thickness of the microlens is thicker than the thickness of the microlens corresponding to the blue light and the thickness of the microlens corresponding to the green light.

According to embodiments, since light is effectively condensed on respective light receiving units, it is possible to improve the characteristic of an image.

Also the difference in height of the respective color filters inhibits a merging between neighboring microlenses in the thermal processing for forming the microlenses so that the microlens array with a zero-gap can be easily formed. Also, a planarization process removing the difference in height between the color filters before formation of the microlenses can be removed so that process simplification can be achieved and cost reduction can be achieved.

The foregoing description describes a scheme where light can be condensed at the same distance from the respective microlenses by controlling the thickness of the respective color filters and the thickness of the respective microlenses.

However, based on the design of the image sensor, a case where the focal length from a microlens is changed in accordance with the respective wavelength bands can be generated. The image sensor according to embodiments of the present invention can advantageously be applied even in such a case.

With the image sensor according to an embodiment, the thickness of a microlens formed on the respective color filter can be determined according to the thickness selection of the respective color filter. Thereby, the distance where light is condensed can selectively be determined according to the thickness control of the microlens.

That is, the image sensor can be designed to implement an optical focus for each color by allowing the focus where the light in the respective wavelength bands is condensed to be intentionally mutually different distances.

As described above, with the image sensor and the fabricating method thereof, light transmitting the red, green, and blue color filters can be condensed at a desired focal length.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor comprising:
a color filter layer having a red color filter with a first thickness, a green color filter with a second thickness, and a blue color filter with a third thickness, wherein the second thickness is thicker than the first thickness, and the third thickness is thicker than the second thickness; and
a microlens array having a first microlens with a fourth thickness formed on the red color filter, a second microlens with a fifth thickness formed on the green color filter, and a third microlens with a sixth thickness formed on the blue color filter, wherein the fifth thickness is thinner than the fourth thickness, and the sixth thickness is thinner than the fifth thickness, wherein the distance where light is condensed through the first microlens, the distance where light is condensed through the second microlens, and the distance where light is condensed through the third microlens are the same.

2. The image sensor according to claim 1, wherein the sum of the first thickness and the fourth thickness, the sum of the second thickness and the fifth thickness, and the sum of the third thickness and the sixth thickness are the same.

3. The image sensor according to claim 1, wherein the microlens array directly contacts the color filter layer.

4. The image sensor according to claim 1, wherein the thickness of the respective microlenses formed on the respective color filters are determined according to the selection of thickness of the red, green, and blue color filter of the color filter layer, and the distance where light is condensed is determined according to the determined thickness of the respective microlenses.

5. A method of fabricating an image sensor comprising:
forming a color filter layer having a red color filter with a first thickness, a green color filter with a second thickness, a blue color filter with a third thickness, wherein the second thickness is formed thicker than the first thickness, and the third thickness is formed thicker than the second thickness;
forming a photoresist for forming a microlens on the color filter layer;
patterning the photoresist for forming the microlens; and
performing a thermal processing to form a microlens array having a first microlens with a fourth thickness formed on the red color filter, a second microlens with a fifth thickness formed on the green color filter, and a third microlens with a sixth thickness formed on the blue color filter, wherein the fifth thickness is formed thinner than the fourth thickness, and the sixth thickness is formed thinner than the fifth thickness; and the distance where light is condensed through the first microlens, the distance where light is condensed through the second microlens, and the distance where light is condensed through the third microlens are formed to be the same.

6. The method according to claim 5, wherein the sum of the first thickness and the fourth thickness, the sum of the second thickness and the fifth thickness, and the sum of the third thickness and the sixth thickness are the same.

7. The method according to claim 5, wherein the microlens array is formed in direct contact with the color filter layer.

8. The method according to claim 5, wherein the thickness of the respective microlenses formed on the respective color filters are determined according to the selection of thickness of the red, green, and blue color filter of the color filter layer and the distance where light is condensed is determined according to the determined thickness of the respective microlens.

9. The method according to claim 5, wherein forming the photoresist for forming the microlens on the color filter layer comprises coating a photoresist on the color filter layer such that a top surface of the photoresist is planar.

10. The method according to claim 5, wherein forming the color filter layer comprises sequentially forming the red color filter, the green color filter, and the blue color filter.

* * * * *